(12) United States Patent
Kuramoto et al.

(10) Patent No.: US 9,214,784 B2
(45) Date of Patent: Dec. 15, 2015

(54) LASER DEVICE

(75) Inventors: Kyosuke Kuramoto, Tokyo (JP);
Takayuki Yanagisawa, Tokyo (JP);
Yoshihito Hirano, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 14/374,696

(22) PCT Filed: Mar. 19, 2012

(86) PCT No.: PCT/JP2012/001893
§ 371 (c)(1),
(2), (4) Date: Jul. 25, 2014

(87) PCT Pub. No.: WO2013/140432
PCT Pub. Date: Sep. 26, 2013

(65) Prior Publication Data
US 2015/0016484 A1     Jan. 15, 2015

(51) Int. Cl.
*H01S 3/091* (2006.01)
*H01S 5/04* (2006.01)
(Continued)

(52) U.S. Cl.
CPC ............ *H01S 5/041* (2013.01); *G02F 1/377* (2013.01); *H01S 3/0627* (2013.01); *H01S 3/109* (2013.01); *G02F 2001/3509* (2013.01); *H01S 3/0401* (2013.01); *H01S 3/0405* (2013.01); *H01S 3/0612* (2013.01); *H01S 3/0615* (2013.01); *H01S 3/0621* (2013.01); *H01S 3/0625* (2013.01);
(Continued)

(58) Field of Classification Search
CPC . H01S 3/0632; H01S 3/09415; H01S 3/1611; H01S 5/105; H01S 5/2031; H01S 5/3211; H01S 5/3213; H01S 2301/166

USPC ............................................................ 372/75
See application file for complete search history.

(56) References Cited

U.S. PATENT DOCUMENTS 7,729,392 B2 *   6/2010   Seitel ............................. 372/10
7,826,500 B2 *  11/2010   Mizuuchi et al. ................. 372/6
(Continued)

FOREIGN PATENT DOCUMENTS

EP        0897206 A1     2/1999
JP        S58-218185 A  12/1983
(Continued)

OTHER PUBLICATIONS

International Search Report; PCT/JP2012/001893; Jun. 5, 2012.
(Continued)

*Primary Examiner* — Jessica Stultz
*Assistant Examiner* — Vu A Vu
(74) *Attorney, Agent, or Firm* — Studebaker & Brackett PC (57) ABSTRACT

An end surface 3b of a solid-state laser element 3 is sloped in such a way that, assuming that laser light is incident upon air from the end surface, an angle of incidence which a normal to an inner side of the end surface forms with a traveling direction of the laser light substantially matches the Brewster angle at the incidence plane, an end surface 4a of a wavelength conversion element 4 is sloped in such a way that, assuming that the laser light is incident upon air from the end surface, an angle of incidence which a normal to an inner side of the end surface forms with a traveling direction of the laser light substantially matches the Brewster angle at the incidence plane, and the end surface 3b and the end surface 4b are arranged in such a way as to be opposite to each other.

19 Claims, 7 Drawing Sheets

(51) Int. Cl.
*G02F 1/377* (2006.01)
*H01S 3/109* (2006.01)
*H01S 3/06* (2006.01)
*H01S 3/0941* (2006.01)
*H01S 3/16* (2006.01)
*H01S 3/04* (2006.01)
*G02F 1/35* (2006.01)

(52) U.S. Cl.
CPC ........... *H01S3/09415* (2013.01); *H01S 3/1611* (2013.01); *H01S 3/1673* (2013.01); *H01S 2301/02* (2013.01)

(56) References Cited

U.S. PATENT DOCUMENTS

| | | |
|---|---|---|
| 7,907,646 B2 | 3/2011 | Mizuuchi et al. |
| 2006/0171429 A1 | 8/2006 | Seitel |
| 2008/0095202 A1 | 4/2008 | Yanagisawa et al. |
| 2008/0273570 A1* | 11/2008 | Moench .......................... 372/71 |
| 2010/0189151 A1* | 7/2010 | Yanagisawa et al. .... 372/45.013 |
| 2010/0303112 A1* | 12/2010 | Yamamoto et al. ............. 372/36 |
| 2011/0051226 A1* | 3/2011 | Vallius et al. ................. 359/326 |

FOREIGN PATENT DOCUMENTS

| | | |
|---|---|---|
| JP | S63-019888 A | 1/1988 |
| JP | H04-229672 A | 8/1992 |
| JP | H05-067824 A | 3/1993 |
| JP | 2010-274292 A | 12/2010 |
| WO | 2006/103767 A1 | 10/2006 |
| WO | 2007/013608 A1 | 2/2007 |

OTHER PUBLICATIONS

The extended European search report issued by the European Patent Office on Oct. 26, 2015, which corresponds to European Patent Application No. 12872044.8-1556 and is related to U.S. Appl. No. 14/374,696.

* cited by examiner

LASER DEVICE

FIELD OF THE INVENTION

The present invention relates to a laser device used for a light source such as a projector device.

BACKGROUND OF THE INVENTION

Light sources of three colors: R (red), G (green), and B (blue) are required as light sources used for a device that displays a color image, such as a projector device or a projection TV. In recent years, as these light sources, wavelength conversion laser devices (laser oscillators) that oscillate laser light in a 900 nm band, laser light in a 1 micrometer band, and laser light in a 1.3 micrometer band as fundamental laser light, and that convert (SHG, Second Harmonic Generation) each fundamental laser light by using a nonlinear material into a second harmonic wave have been developed.

As an example of a wavelength conversion laser device, there has been provided a wavelength conversion laser device that consists of a semiconductor laser element, a solid-state laser element, and a wavelength conversion element (refer to patent reference 1). In this wavelength conversion laser device, the solid-state laser element absorbs pumping light generated by the semiconductor laser element to generate a fundamental wave of laser light, and the wavelength conversion element converts the wavelength of the fundamental wave generated by the solid-state laser element to generate a second harmonic wave. The three elements in this wavelength conversion laser device are produced individually, and alignment is performed in such a way that their optical axes are aligned with one another. Further, a coating having optimal reflectivity for each of the fundamental wave and the second harmonic wave is applied to each of front and rear end surfaces of each of the elements.

In a case in which the solid-state laser element and the wavelength conversion element are integral with each other with joining, the coating on a joining plane side of each of the elements becomes unnecessary, and the alignment between the elements also becomes unnecessary, and therefore it becomes possible to provide an improvement in the ease of production, a cost reduction, etc.

Figure 16:
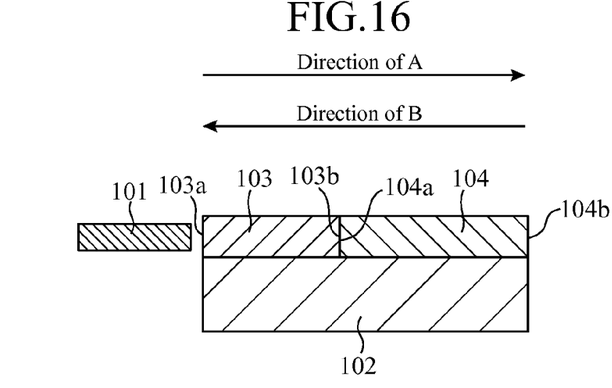
FIG. 16 is a structural diagram showing a wavelength conversion laser device in which a solid-state laser element and a wavelength conversion element are integrally formed.

FIG. 16 is a block diagram showing a wavelength conversion laser device in which a solid-state laser element and a wavelength conversion element are integral with each other with joining. In the wavelength conversion laser device shown in FIG. 16, the solid-state laser element 103 and the wavelength conversion element 104 are arranged in front of a semiconductor laser element 101 that generates pumping light, and the solid-state laser element 103 and the wavelength conversion element 104 are secured onto a heat sink 102 for cooling. An end surface 103a and an end surface 103b are formed on the solid-state laser element 103, an end surface 104a and an end surface 104b are formed on the wavelength conversion element 104, and the end surface 103b of the solid-state laser element 103 and the end surface 104b of the wavelength conversion element 104 are joined to each other.

The end surface 103a of the solid-state laser element 103 has a reflecting film that allows the pumping light emitted from the semiconductor laser element 101 to pass therethrough, and that total-reflects a fundamental wave of laser light generated by the solid-state laser element 103. In contrast, the end surface 104b of the wavelength conversion element 104 has an optical film that reflects the fundamental wave and that allows a second harmonic wave of laser light to pass therethrough. Each of these total reflection film, antireflection film, and optical film consists of, for example, dielectric thin films which are laminated.

As a method of joining the solid-state laser element 103 and the wavelength conversion element 104 to each other, a method of optically joining them to each other by using an optical contact, diffusion bonding, or surface activated bonding is chosen in many cases. As a method of positioning the semiconductor laser element 101, an active alignment method of adjusting and fixing the position of the semiconductor laser element 101 in such away that the light intensity of the laser light outputted from the wavelength conversion element 104 is maximized when the pumping light is emitted from the semiconductor laser element 101 is used typically.

When the laser light emitted from the semiconductor laser element 101 is incident upon the solid-state laser element 103, activity ions are pumped within the solid-state laser element 103, and, as a result, a fundamental wave laser-oscillates. At this time, the reflecting surfaces (resonance surfaces) that construct the resonator of the fundamental wave are the end surface 103a which is the rear end surface of the solid-state laser element 103 and the end surface 104b which is the front end surface of the wavelength conversion element 104. Hereafter, a case in which the fundamental wave traveling in a direction of A shown in the figure is reflected by the end surface 103b or the end surface 104a, or a case in which the fundamental wave traveling in a direction of B shown in the figure is reflected by the end surface 103b or the end surface 104a will be considered. In this case, because the reflected wave is usually not in phase with the fundamental wave, the reflected wave results in an optical loss without contributing to the oscillation. More specifically, when reflection occurs at the end surface 103b or the end surface 104a, the light density of the fundamental wave generated by the solid-state laser element 103 drops and hence the optical power characteristics of the second harmonic wave get worse.

Generally, because the thermal expansion coefficient of the solid-state laser element 103 does not completely match that of the wavelength conversion element 104, the joining between them may unstick due to generation of heat at the time of assembling them and heat caused by operation, and a gap may occur between them. In the conventional laser device, there is a case in which even when this gap is very narrow, the reflection increases according to the refractive index difference between each element and the gap (air), and the optical power characteristics get worse.

Hereafter, a case in which the oscillation wavelength of the semiconductor laser element 101 is 808 nm, Nd:YVO4 (Nd-doped yttrium vanadate crystal) is used as the solid-state laser element 103, and PPLN (Periodically Poled Lithium Niobate) is used as the wavelength conversion element 104 will be considered. In this case, the solid-state laser element 103 generates a fundamental wave having a wavelength of 1,064 nm by using the pumping light emitted from the semiconductor laser element 101.

Figure 17:
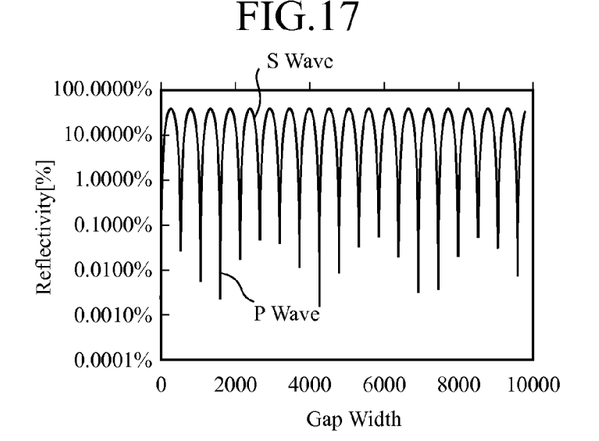
FIG. 17 is an explanatory drawing showing the results of simulation of determining reflectivity at the time when changing the width of a gap between a solid-state laser element and a wavelength conversion element in consideration of multipath reflection of an electric field by using the Fresnel formulae.
Figure 18:
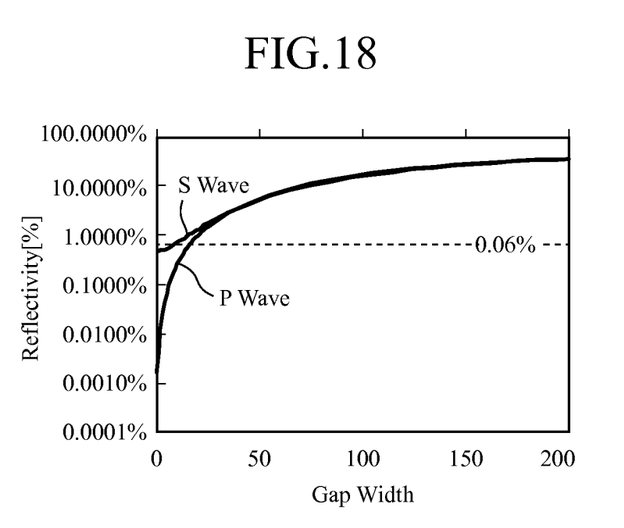
FIG. 18 is an explanatory drawing showing the results of simulation of determining the reflectivity at the time when changing the width of the gap between the solid-state laser element and the wavelength conversion element in consideration of multipath reflection of an electric field by using the Fresnel formulae.

FIGS. 17 and 18 show the result of simulation of determining the reflectivity when changing the width of the gap between the solid-state laser element 103 and the wavelength conversion element 104 in consideration of multipath reflection of an electric field by using the Fresnel formulae. Because the polarization of the fundamental wave generated by the solid-state laser element 103 is made to be P in many cases, a P wave will be considered hereafter. Although it is necessary to make the reflectivity at the joining portion between the solid-state laser element 103 and the wavelength conversion element 104 be about 0.6% or less in order to provide adequate optical power characteristics, the gap width permitted at this time is very as small as 16 nm or less. In an actual element, the gap width easily exceeds this permitted gap width, and, as a result, the optical power characteristics get worse. In addition, because increase of the gap width reduces the difference between the reflectivity of the P wave and that of the S wave, an oscillation (parasitic oscillation) of the S wave which does not contribute to the wavelength conversion occurs easily.

RELATED ART DOCUMENT

Patent Reference

Patent reference 1: WO 2006/103767

SUMMARY OF THE INVENTION

Problems to be Solved by the Invention

Because conventional laser devices are constructed as above, a problem is that even if the gap between the solid-state laser element 103 and the wavelength conversion element 104 is very narrow, the reflection increases according to the refractive index difference between each of the solid-state laser element 103 and the wavelength conversion element 104, and the gap (air), and the optical power characteristics get worse. Another problem is that an oscillation (parasitic oscillation) of the S wave which does not contribute to the wavelength conversion occurs easily.

The present invention is made in order to solve the above-mentioned problems, and it is therefore an object of the present invention to provide a laser device that even though joining between a solid-state laser element and a wavelength conversion element (optical element) unsticks and a gap occurs, can suppress deterioration of the optical power characteristics, and that can prevent a parasitic oscillation resulting from reflection at the joining portion even though the joining between the solid-state laser element and the wavelength conversion element does not unstick.

Means for Solving the Problem

In accordance with the present invention, there is provided a laser device including a pump laser that emits pumping light, a solid-state laser element that absorbs the pumping light emitted from the pump laser to generate laser light, and an optical element upon which the laser light generated by the solid-state laser element is incident, in which an end surface of the solid-state laser element is sloped in such a way that, in a case in which it is assumed that the laser light is incident upon air from the end surface of the solid-state laser element, an angle of incidence which a normal to an end face on a side of the solid-state laser element in a plane of the incidence forms with a traveling direction of the laser light substantially matches the Brewster angle at the incidence plane, an end surface of the optical element is sloped in such a way that, in a case in which it is assumed that the laser light is incident upon air from the end surface of the optical element, an angle of incidence which a normal to an end face on a side of the optical element in a plane of the incidence forms with a traveling direction of the laser light substantially matches the Brewster angle at the incidence plane, and the end surface of the solid-state laser element and the end surface of the optical element are arranged in such a way as to be opposite to each other, and in which at least one of the solid-state laser element and the optical element, a clad layer is formed on at least one of the surfaces parallel to an optical axis in the solid-state laser element and an optical axis in the optical element and perpendicular to a plane including the optical axes and an angle of emergence so that the laser device has a structure of waveguide type.

Advantages of the Invention

According to the present invention, an end surface of the solid-state laser element is sloped in such a way that, in a case in which it is assumed that the laser light is incident upon air from the end surface of the solid-state laser element, an angle of incidence which a normal to an end face on a side of the solid-state laser element in a plane of the incidence forms with a traveling direction of the laser light substantially matches the Brewster angle at the incidence plane, an end surface of the optical element is sloped in such a way that, in a case in which it is assumed that the laser light is incident upon air from the end surface of the optical element, an angle of incidence which a normal to an end face on a side of the optical element in a plane of the incidence forms with a traveling direction of the laser light substantially matches the Brewster angle at the incidence plane, and the end surface of the solid-state laser element and the end surface of the optical element are arranged in such a way as to be opposite to each other, and in at least one of the solid-state laser element and the optical element, a clad layer is formed on at least one of the surfaces parallel to the optical axis in the solid-state laser element and the optical axis in the optical element and perpendicular to a plane including the optical axes and an angle of emergence so that the laser device has a structure of waveguide type. Therefore, there is provided an advantage of, even though joining between the solid-state laser element and the optical element unsticks and a gap occurs, being able to suppress deterioration of the optical power characteristics, and being able to prevent a parasitic oscillation resulting from reflection at the joining portion even though the joining between the solid-state laser element and the optical element does not unstick.

EMBODIMENTS OF THE INVENTION

Hereafter, in order to explain this invention in greater detail, the preferred embodiments of the present invention will be described with reference to the accompanying drawings. Embodiment 1.

Figure 1:
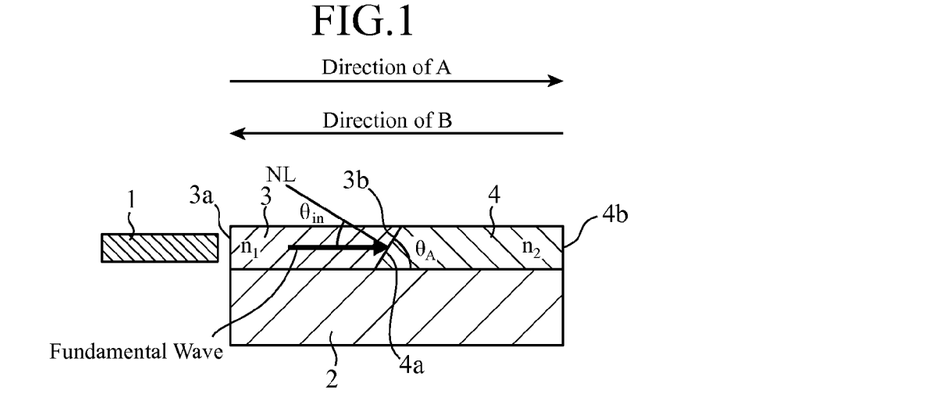
FIG. 1 is a side view showing a laser device in accordance with Embodiment 1 of the present invention.

FIG. 1 is a side view showing a laser device in accordance with Embodiment 1 of the present invention. Referring to FIG. 1, a semiconductor laser element 1 is a pump laser that emits pumping light having a wavelength of 808 nm, and is arranged in the vicinity of an end surface 3a of a solid-state laser element 3. To the semiconductor laser element 1, a heat sink for cooling (not shown) is joined as needed. A heat sink 2 is a member for cooling, and is made from a material having high thermal conductivity. For example, a material, such as Si, is used.

The solid-state laser element 3 is made from, for example, Nd:YVO4 (Nd doped yttrium vanadate crystal), and is placed in on the heat sink 2. The solid-state laser element 3 absorbs the pumping light emitted from the semiconductor laser element to generate a fundamental wave of laser light (e.g., fundamental wave having a wavelength of 1,064 nm). On the solid-state laser element 3, an end surface 3a upon which the pumping light emitted from the semiconductor laser element 1 is incident, and an end surface 3b from which the generated fundamental wave is emitted are formed. The end surface 3b is sloped in such a way that, when it is assumed that the fundamental wave generated by the solid-state laser element 3 is incident upon the air from the end surface 3b, an angle of incidence $\theta_{in}$ (=$\theta_1$) which a normal NL to an end plane on a side of the solid-state laser element 3 in the plane of incidence forms with a traveling direction of the fundamental wave substantially matches the Brewster angle ($\theta_{B1}$) at the plane of incidence.

A wavelength conversion element 4, which is an optical element, is made from PPLN (Periodically Poled Lithium Niobate) which is a nonlinear material, and is placed on the heat sink 2. The wavelength conversion element 4 converts the wavelength of the fundamental wave generated by the solid-state laser element 3, and outputs, for example, a second harmonic wave having a wavelength of 532 nm. On the wavelength conversion element 4, an end surface 4a upon which the fundamental wave generated by the solid-state laser element 3 is incident, and an end surface 4b from which the second harmonic wave which is the laser light whose wavelength is converted is outputted are formed. The end surface 4a of the wavelength conversion element 4 is optically joined to the end surface 3b of the solid-state laser element 3 by using an optical contact, diffusion bonding, or surface activated bonding. The end surface 4a is sloped in such a way that, when it is assumed that the fundamental wave is incident upon the air from the end surface 4a of the wavelength conversion element 4, an angle of incidence ($\theta_2$) which a normal (not shown) to an end plane on a side of the wavelength conversion element 4 in the plane of incidence forms with a traveling direction of the fundamental wave (a direction opposite to the traveling direction of the fundamental wave shown in FIG. 1) substantially matches the Brewster angle ($\theta_{B2}$) at the plane of incidence.

Concretely, the slope formed in the end surface 3b of the solid-state laser element 3 and the slope formed in the end surface 4a of the wavelength conversion element 4 are as follows.

(1) The slope formed in the end surface 3b of the solid-state laser element 3

Angle of incidence $\theta_1$=(Brewster angle $\theta_{B1}$ or Brewster angle $\theta_{B2}$)

or Brewster angle $\theta_{B1}$<Angle of incidence $\theta_1$<Brewster angle $\theta_{B2}$ or Brewster angle $\theta_{B2}$<Angle of incidence $\theta_1$<Brewster angle $\theta_{B1}$ (2) The slope formed in the end surface 4a of the wavelength conversion element 4

Angle of incidence $\theta_2$=(Brewster angle $\theta_{B1}$ or Brewster angle $\theta_{B2}$)

or Brewster angle $\theta_{B1}$<Angle of incidence $\theta_2$<Brewster angle $\theta_{B2}$ or Brewster angle $\theta_{B2}$<Angle of incidence $\theta_2$<Brewster angle $\theta_{B1}$ Next, the operation of the laser device will be explained. When the pumping light emitted from the semiconductor laser element 1 is incident upon the solid-state laser element 3 from the end surface 3a, activity ions are pumped in the solid-state laser element 3. A fundamental wave is generated by the solid-state laser element 3 as a result of the pumping. When the fundamental wave generated by the solid-state laser element 3 is incident upon the wavelength conversion element 4 from the end surface 4a after the fundamental wave is emitted from the end surface 3b, the wavelength of the fundamental wave is converted in the wavelength conversion element 4. As a result of the wavelength conversion, a second harmonic wave is outputted.

In this embodiment, an optical film that total-reflects the fundamental wave generated by the solid-state laser element while allowing the pumping light emitted from the semiconductor laser element 1 to pass therethrough is formed on the end surface 3a of the solid-state laser element 3. Further, it is preferable to cause a second harmonic wave which is generated in the wavelength conversion element 4 by the fundamental wave reflected by the end surface 4b of the wavelength conversion element 4, and which travels toward the end surface 3b to be reflected by the end surface 3a of the solid-state laser element 3 to extract the second harmonic wave from the end surface 4b of the wavelength conversion element 4. Therefore, it is desirable that an optical film that total-reflects the fundamental wave generated by the solid-state laser element 3 while total-reflecting the second harmonic wave is formed on the end surface 3a of the solid-state laser element 3. On the other hand, an optical film that reflects the fundamental wave and allows the second harmonic wave to pass therethrough is formed on the end surface 4b of the wavelength conversion element 4. Each of these total reflection film, antireflection film, and optical film consists of, for example, dielectric thin films which are laminated.

The end surface 3b of the solid-state laser element 3 and the end surface 4a of the wavelength conversion element 4 are joined to each other by using diffusion bonding, an optical contact, or the like. Although a joining plane at which such end surfaces are joined to each other is perpendicular to a traveling direction of a fundamental wave in a conventional laser device, the joining plane at which the end surface 3b and the end surface 4a are joined to each other is sloped in the laser device according to this Embodiment 1.

A tilt angle $\theta_A$ of the end surface 3b of the solid-state laser element 3 is set up to make the angle of incidence $\theta_{in}$ of the fundamental wave be equal to the Brewster angle in such a way that all of the fundamental wave generated by the solid-state laser element 3 passes through the end surface if exiting from the solid-state laser element 3 into the air. In this case, the Brewster angle exists only for a wave having polarization in a plane parallel to the page, i.e., for a so-called P wave. Hereafter, this P wave will be considered. When the refractive index of the solid-state laser element 3 is expressed by $n_1$ and the refractive index of the air is expressed by $n_3$ (=1), the Brewster angle $\theta_B$ is expressed by the following equation (1).

$$\theta_B = \tan^{-1}\left(\frac{n_3}{n_1}\right) = \tan^{-1}\left(\frac{1}{n_1}\right) \quad (1)$$

Figure 2:
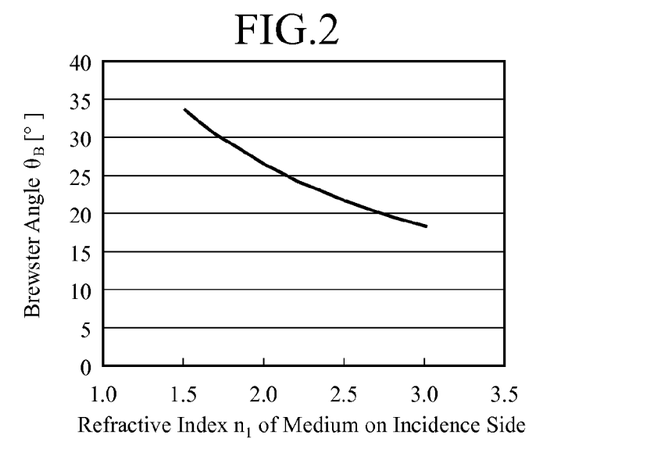
FIG. 2 is an explanatory drawing showing a Brewster angle $\theta_B$ in a case in which the refractive index of a solid-state laser element 3 is $n_1$.

The Brewster angle $\theta_B$ in a case in which the refractive index of the solid-state laser element 3 is $n_1$ is shown in FIG. 2. For example, because the Brewster angle $\theta_B$ is 24.8 degrees when the refractive index $n_1$ of the solid-state laser element 3 is 2.165, the tilt angle $\theta_A$ (=90 degrees–$\theta_B$) is 65.2 degrees.

Figure 3:
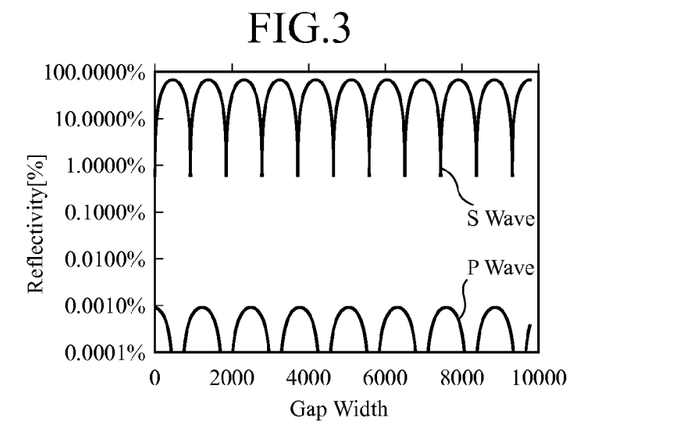
FIG. 3 is an explanatory drawing showing the results of simulation of the reflectivity of a fundamental wave traveling in a direction of A of FIG. 1 when changing the width of a gap between the solid-state laser element 3 and a wavelength conversion element 4.
Figure 4:
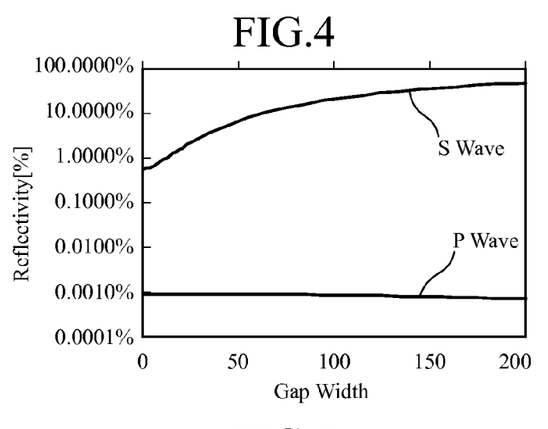
FIG. 4 is an explanatory drawing showing the results of simulation of the reflectivity of the fundamental wave traveling in the direction of A of FIG. 1 when changing the width of the gap between the solid-state laser element 3 and the wavelength conversion element 4.

Hereafter, a case in which the end surface 3b is formed in such a way that the angle of incidence $\theta_{in}$ of the fundamental wave is equal to the Brewster angle of 24.8 degrees, and the end surface 4a is formed in such a way as to be parallel to the end surface 3b will be considered. FIGS. 3 and 4 show the results of simulating the reflectivity of the fundamental wave traveling in a direction of A parallel to a lower surface of the solid-state laser element 3 and a lower surface of the wavelength conversion element 4 when changing the width of a gap between the solid-state laser element 3 and the wavelength conversion element 4. The reflectivity for the P wave is equal to or less than about 0.001% at any distance, and is very small as compared with the case of a conventional structure (FIGS. 17 and 18).

Figure 5:
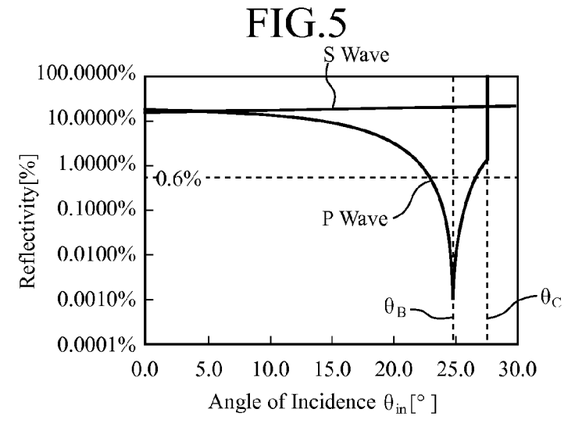
FIG. 5 is an explanatory drawing showing a relationship between an angle of incidence $\theta_{in}$ and the reflectivity when the gap width is 100 nm.

Further, in the case in which the gap width is 100 nm, a relationship between the angle of incidence $\theta_{in}$ and the reflectivity is as shown in FIG. 5, and the angle of incidence $\theta_{in}$ is equal to the Brewster angle of 24.8 degrees and the reflectivity is a minimum of $6 \times 10^5$%. When the permitted reflectivity is assumed to be 0.6% or less, it is seen from FIG. 5 that a lower limit angle required to satisfy this reflectivity is 22.8 degrees and an upper limit angle is 26.6 degrees. Because the reflectivity on a side of the upper limit angle becomes high rapidly when the angle of incidence is close to an angle at which the fundamental wave is totally reflected, i.e., a so-called critical angle $\theta_c$, the upper limit angle is always equal to or less than $\theta_c$. $\theta_c$ is given by the following equation (2), and is 27.5 degrees in this case.

$$\theta_C = \sin^{-1}\left(\frac{n_3}{n_1}\right) = \sin^{-1}\left(\frac{1}{n_1}\right) \quad (2)$$

The fundamental wave traveling in the direction of A and passing through the end surface 3b and the end surface 4a is partially reflected by the end surface 4b, and then travels in a direction of B which is an opposite direction. A case in which assuming that this direction of B is parallel to the lower surface of the solid-state laser element 3 and the lower surface of the wavelength conversion element 4, this fundamental wave passes through the joining portion where the end surface 4a and the end surface 3b are joined to each other will be considered. Because in the case in which the end surface 3b and the end surface 4a are parallel to each other, the angle of incidence $\theta_{in}$ of the fundamental wave is equal to that in the above-mentioned case, the same argument holds water. However, because the medium on aside of the incidence is the wavelength conversion element 4 which is a nonlinear element, it is necessary to replace the refractive index $n_1$ (=2.1650) in the equations (1) and (2) with a refractive index $n_2$ (=2.1484). The refractive index $n_3$ is the same as that of the air in both the cases. Therefore, while $\theta_B$ is 24.8 degrees in the case of the fundamental wave traveling in the direction of A, $\theta_B$ is 25.0 degrees in the case of the fundamental wave traveling in the direction of B.

Figure 6:
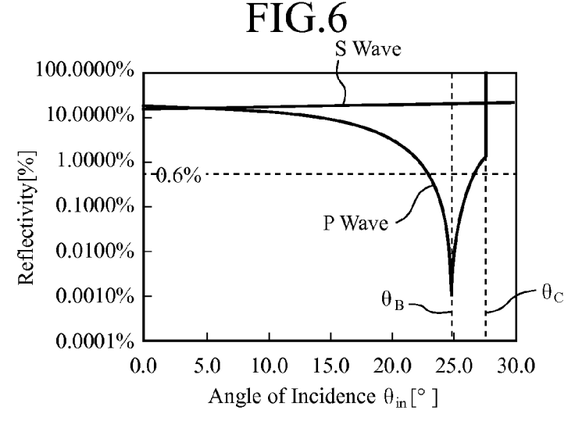
FIG. 6 is an explanatory drawing showing a relationship between the angle of incidence $\theta_{in}$ of a fundamental wave traveling in a direction of B of FIG. 1 and the reflectivity.

A relationship between the angle of incidence $\theta_{in}$ of the fundamental wave traveling in the direction of B and the reflectivity is as shown in FIG. 6, and the reflectivity has a minimum when the angle of incidence is close to 25.0 degree which is the Brewster angle. Assuming that the permitted reflectivity is 0.6% or less, the required lower limit angle is 23.0 degrees and the upper limit angle is 26.8 degrees. Because the required lower limit angle is 22.8 degrees and the upper limit angle is 26.6 degrees in the case of the fundamental wave traveling in the direction of A, it is seen that when the angle of incidence $\theta_{in}$ is changed from 23.0 degrees to 26.6 degrees, the reflectivity of the fundamental wave can be set to 0.6% or less in both the cases. Because the end surface 3b and the end surface 4a are formed to be parallel to each other in this Embodiment 1, the angle of incidence $\theta_{in}$ for the fundamental wave traveling in the direction of B is 24.8 degrees. The reflectivity at this time is about 0.006%.

Therefore, in the laser device according to this Embodiment 1, the optical loss caused by reflection at this joining portion is about 0.006% for the fundamental wave going back and forth between the end surface 3a and the end surface 4b disposed as reflecting surfaces, and therefore only a very small reflection loss occurs even though the gap exists. It is also clear from the above-mentioned results that as the Brewster angle calculated for the case of traveling in the direction of A becomes closer to the Brewster angle calculated for the case of traveling in the direction of B, the angle range determined in order to reduce the reflection loss of the entire laser device becomes wider. This is synonymous with saying that as the refractive index of the solid-state laser element 3 becomes closer to the refractive index of the wavelength conversion element 4, the angle range determined in order to reduce the reflection loss of the entire laser device becomes wider. However, it is needless to say that if the angle can be set in such a way that the sum of reflection losses at the joining portion is equal to or less than a desired loss even when both the refractive indices are different from each other, satisfactory optical power characteristics can be acquired.

Further, there is a case in which the solid-state laser element 3 or the wavelength conversion element 4 is made from a material having birefringence, i.e., a material in which refractive indices differ depending upon polarization directions. It is needless to say that in this case, what is necessary is just to take into consideration the refractive index which the fundamental wave propagating perceives. This is because the reflectivity at the time when the fundamental wave is reflected by the end surface is argued.

Figure 7:
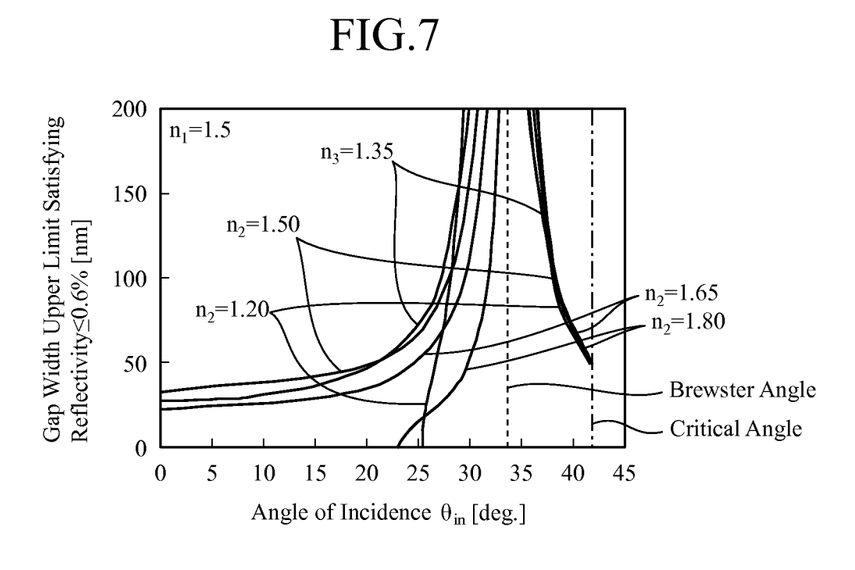
FIG. 7 is an explanatory drawing showing the results of simulation of a maximum gap width which provides reflectivity of 0.6% for each value of the refractive index $n_2$ of the solid element on an emergence side when the refractive index $n_1$ of the solid element on an incidence side is 1.5.
Figure 8:
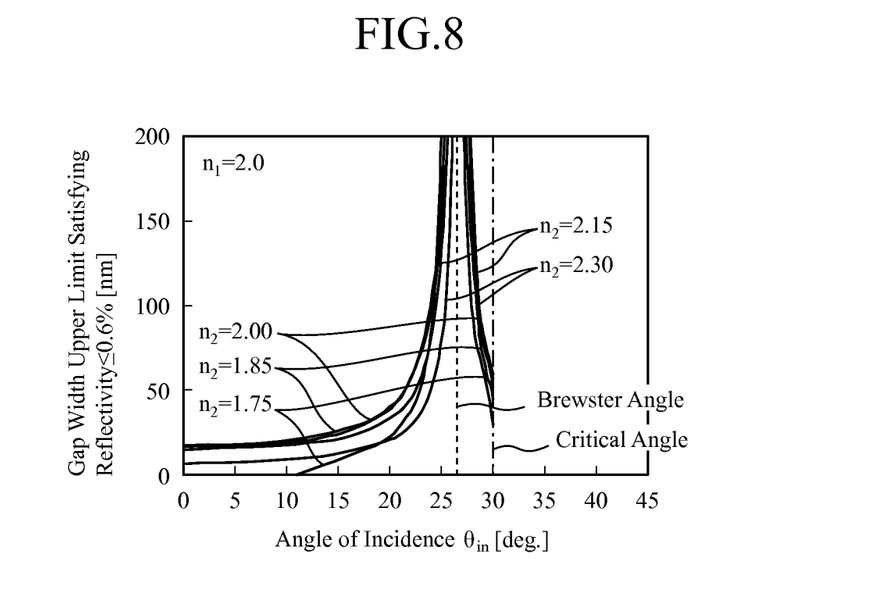
FIG. 8 is an explanatory drawing showing the results of simulation of a maximum gap width which provides reflectivity of 0.6% for each value of the refractive index $n_2$ of the solid element on an emergence side when the refractive index $n_1$ of the solid element on an incidence side is 2.0.
Figure 9:
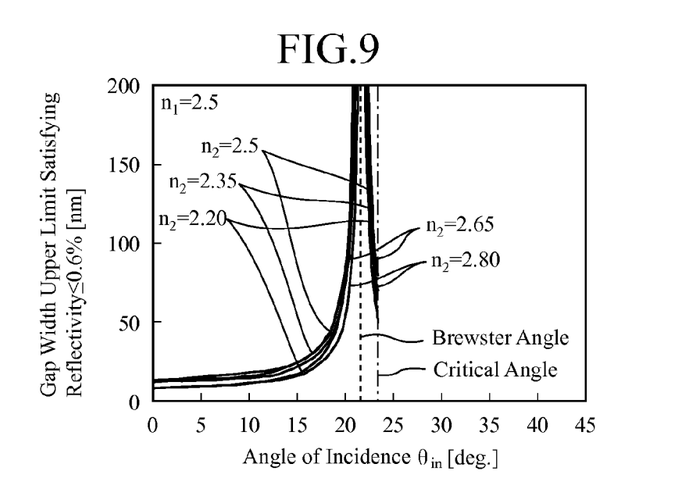
FIG. 9 is an explanatory drawing showing the results of simulation of a maximum gap width which provides reflectivity of 0.6% for each value of the refractive index $n_2$ of the solid element on an emergence side when the refractive index $n_1$ of the solid element on an incidence side is 2.5.

FIGS. 7 to 9 show the results of simulating the maximum of the width of the gap between both the media at which the reflectivity of the incident light (in Embodiment 1, the fundamental wave generated by the solid-state laser element 3) is 0.6% or less for the angle of incidence (in Embodiment 1, $\theta_{in}$) when the wavelength of the fundamental wave is 1,064 nm, the refractive index of the medium on a side of the incidence (in Embodiment 1, the solid-state laser element 3) is expressed by $n_1$, the refractive index of the medium on a side of the emergence (in Embodiment 1, the wavelength conversion element 4) is expressed by $n_2$, and the refractive index of the air in the gap between both the media is 1. The results correspond to those in the case of $\theta_{in}=0$ degrees in a conventional laser device. These results are based on a simulation process of determining the maximum in consideration of multipath reflection of an electric field by using the Fresnel formulae, like in the case of the gap width dependence of the reflectivity as shown in FIGS. 17 and 18.

It can be seen from these simulation results that the angle at which the reflectivity of the incident light is 0.6% or less exists while having a width centered at the Brewster angle for any combination of the refractive index $n_1$ and the refractive index $n_2$. Although the results are shown including a limited number of combinations, also for any other combination, the Brewster angle and the critical angle can be determined by using the same simulation as that for the reflectivity according to the equations (1) and (2).

As can be seen from the above description, because the reflection loss can be reduced even when the gap width is not 0 in the laser device in accordance with this Embodiment 1, the laser device can also be constructed in such a way that the end surface 3b and the end surface 4b are apart from each other. Further, it is not necessarily necessary to make the angle of incidence at the end surface 3b be the same as that at the end surface 4a (it is necessarily unnecessary to make the end surface 3a be completely parallel to the end surface 4b), and it is also possible to optimize the angles in such a way that the loss occurring in the fundamental wave while going around between the end surface 3a and the end surface 4b, which are the resonator surfaces, is minimized. In addition, according to this Embodiment 1, while the reflectivity of the P wave can be decreased, the reflectivity of the S wave can be increased to higher reflectivity than that of the P wave. More specifically, because the loss occurring in the S wave can be increased, there can also be provided an advantage of being able to suppress the parasitic oscillation of the S wave.

Although the example of $\theta_A$ degrees=90 degrees−$\theta_{B1}$ degrees is shown in this Embodiment 1, this embodiment is not limited to this example. As an alternative, $\theta_A$ can be set to be equal to 90 degrees+$\theta_{B1}$ degrees. In this case, because the laser device has a vertically symmetric shape, the same argument can be applied and the same advantages can be provided.

Although the example of using Nd:YVO4 as the solid-state laser element 3 is shown in this Embodiment 1, this embodiment is not limited to this example using Nd:YVO4. As an alternative, a general laser medium can be used. As a general laser medium, for example, Nd:GdVO4 (Nd-doped gadolinium orthovanadate crystal) can be used. As an alternative, Nd:YAG, Nd:YLF, Nd:Glass, Yb:YAG, Yb:YLF, Yb:KGW, Er:Glass, Er:YAG, Tm:YAG, Tm:YLF, Ho:YAG, Ho:YLF, Ti:Sapphire, Cr:LiSAF, or the like can be used.

Although the example in which the wavelength conversion element 4 uses PPLN is shown in this Embodiment 1, MgO-doped PPLN resistant to optical damage can be alternatively used. As an alternative, MgO-doped PPLT (Periodic Poled LiTaO3: periodically poled lithium niobate crystal) can be used as the wavelength conversion element 4. A general material for wavelength conversion can be alternatively used as the wavelength conversion element 4, and, as a general material for wavelength conversion, for example, KTP, KN, BBO, LBO, CLBO, LiNbO3, LiTaO3, or the like is provided. Further, because the power density of the incident fundamental wave can be raised by using MgO-doped LiNbO3, MgO-doped LiTaO3, stoichiometric LiTAO3, or the like which is resistant to optical damage, efficient wavelength conversion can be implemented. In addition, by using MgO-doped LiNbO3, MgO-doped LiTaO3, stoichiometric LiNbO3, stoichiometric LiTaO3, KTP, or the like having a periodically polarization-reversed structure, the nonlinear constant can be increased and further efficient wavelength conversion can be implemented.

As the combination of the solid-state laser element 3 and the wavelength conversion element 4, for example, Nd:YVO4 and MgO-doped LiNbO3, Nd:YVO4 and MgO-doped LiTaO3, Nd:GdVO4 and MgO-doped LiNbO3, Nd:GdVO4 and MgO-doped LiTaO3, or the like is provided. In this case, because both the refractive indices are close to each other, the Brewster angle of the solid-state laser element 3 is made to be close to that of the wavelength conversion element 4, and the optical loss at the time of making the angles with which both the end surfaces are formed be equal to each other can be reduced.

It is desirable to use vapor deposition solder (e.g., AuSn solder) whose thickness can be easily controlled as a joining agent for joining the solid-state laser element 3 and the wavelength conversion element 4 to the heat sink 2. Further, the heat sink 2 is made from a material having high thermal conductivity. For example, Si or the like is used.

Next, a method of producing the laser device shown in FIG. 1 will be explained. First, one end surface of the solid-state laser element 3 is ground in such a way that the tilt angle $\theta_A$ (=90 degrees−$\theta_{B1}$) at the end surface is as shown in FIG. 1, so that the end surface 3b is formed. Next, one end surface of the wavelength conversion element 4 is ground in such away that the tilt angle $\theta_A$ (=90 degrees−$\theta_{B1}$) at the end surface is as shown in FIG. 1, so that the end surface 4a is formed. After that, the end surface 3b and the end surface 4a are joined to each other by using an optical contact, diffusion bonding, or the like, the upper and lower surfaces or one of them is ground in such a way that the elements have a desired thickness. This thickness typically ranges from several um to several hundred um.

Next, the end surface 3a of the solid-state laser element 3 and the end surface 4b of the wavelength conversion element 4 are ground in such a way as to be perpendicular to the upper and lower surfaces. The length in a direction of the optical axis of each of the solid-state laser element 3 and the wavelength conversion element 4 typically ranges from several hundred um several ten mm. After that, an optical film is formed on each of the end surfaces 3a and 4b. After that, after the integral element which consists of the solid-state laser element 3 and the wavelength conversion element 4 is joined to the heat sink 2, the integral unit is cut in such a way as to have a desired width. It is preferable to use, as a cutting method, laser beam machining which does not produce chips and so on. Further, as a method of joining the end surface 3b and the end surface 4a to each other, there is also a method of grinding the upper and lower surfaces of the solid-state laser element 3 and those of the wavelength conversion element 4 to make them have a desired thickness, and joining the end surfaces to each other.

In the case of making the angle of the end surface 3b and that of the end surface 4a be the same tilt angle $\theta_A$, the end surfaces can be joined to each other without any gap between them. In the case of making the angle of the end surface 3b and that of the end surface 4a be tilt angles $\theta_A$ close to each other, for example, in the case of making the tilt angle $\theta_A$ of the end surface 3b be 90 degrees–24.8 degrees=65.2 degrees and also making the tilt angle $\theta_A$ of the end surface 4a be 90 degrees–25.0 degrees=65.0 degrees, the total loss can be minimized because the reflectivity at each end surface can be minimized.

Although the above explanation is made as to the case in which the solid-state laser element 3 and the wavelength conversion element 4 are joined to each other, the laser device can be constructed in such a way that the solid-state laser element 3 and the wavelength conversion element 4 are apart from each other. In this case, the solid-state laser element 3 and the wavelength conversion element 4 are joined to the heat sink 2 in a state in which the solid-state laser element 3 and the wavelength conversion element 4 are apart from each other, and, after that, the integral unit is cut in such a way as to have a desired width. At this time, it is necessary to align the height of the solid-state laser element 3 with that of the wavelength conversion element 4. To this end, it is desirable to use vapor deposited solder (e.g., AuSn solder) whose thickness can be easily controlled when joining the solid-state laser element 3 and the wavelength conversion element 4 to the heat sink 2.

Although the example of using the solid-state laser element 3 as a first optical element is shown in this Embodiment 1, the first optical element is not limited to the solid-state laser element 3, and another optical element can be alternatively used. Further, when the first optical element and a second optical element (wavelength conversion element 4) are arranged, it is also possible to apply the structure according to the present invention to the joining between the first optical element and the second optical element. In addition, although the example of using the wavelength conversion element 4 (SHG element) that generates a second harmonic wave as the second optical element is shown in this Embodiment 1, the second optical element is not limited to the wavelength conversion element 4. For example, an optical element used for sum frequency generation (SFG) or an optical parametric oscillator (GPO), or a polarizer or a Q switch element can be used. Also in this example, it is clear that the advantages of the present invention can be provided.

Although the example in which the wavelength of the fundamental wave is 1,064 nm is shown in this Embodiment 1, it is needless to say that the wavelength of the fundamental wave is not limited to 1,064 nm, and the fundamental wave can have another wavelength. Further, although the example which the shapes of the solid-state laser element 3 and the wavelength conversion element 4 are plate-like ones is shown in this Embodiment 1, the shapes of the solid-state laser element 3 and the wavelength conversion element 4 are not limited to plate-like ones. For example, the shapes of the elements can be cylindrical ones. It is needless to say that the same advantages can be provided in this case. However, in the case in which the shapes of the elements are plate-like ones, there can be provided an advantage of facilitating the production, such as facilitating alignment between the optical axis of the solid-state laser element 3 and that of the wavelength conversion element 4, by, for example, joining their bottoms surfaces to the heat sink 2.

Embodiment 2

Figure 10:
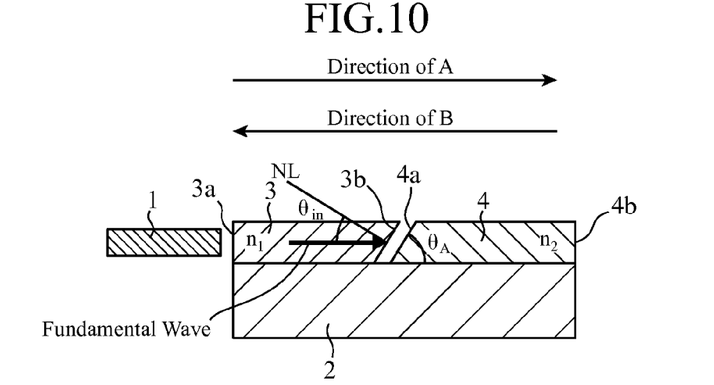
FIG. 10 is a side view showing a laser device in accordance with Embodiment 2 of the present invention.

FIG. 10 is a side view showing a laser device in accordance with Embodiment 2 of the present invention. This Embodiment 2 differs from above-mentioned Embodiment 1 in that a gap is formed without joining the end surface 3b of the solid-state laser element 3 and the end surface 4a of the wavelength conversion element 4 to each other. It is mentioned above that the same advantages as those provided by above-mentioned Embodiment 1 are provided also in this case.

A method of producing the laser device shown in FIG. 10 is the one of excluding a process of joining the end surface 3b of the solid-state laser element 3 and the end surface 4a of the wavelength conversion element 4 to each other from the method of producing the laser device in accordance with above-mentioned Embodiment 1. More specifically, after the solid-state laser element 3 and the wavelength conversion element 4 are produced individually, the solid-state laser element 3 and the wavelength conversion element 4 are arranged on a heat sink 2. As an alternative, there can be considered a method of forming end surfaces and a lower surface of the solid-state laser element 3 and those of the wavelength conversion element 4 by, for example, grinding the elements, and, after that, joining these lower surfaces to the heat sink 2 and then grinding their upper surfaces.

Embodiment 3

Figure 11:
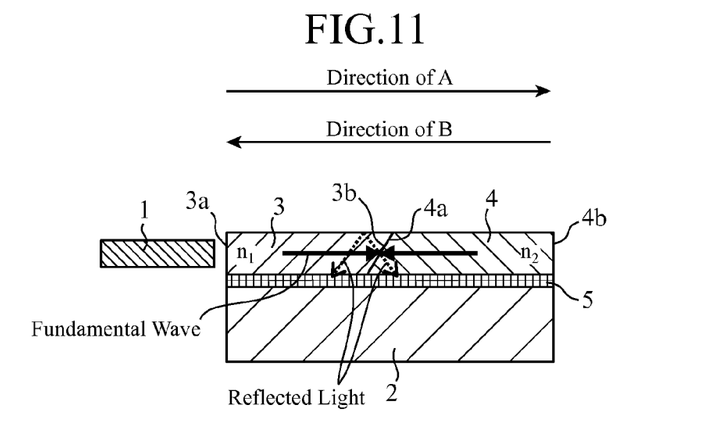
FIG. 11 is a side view showing a laser device in accordance with Embodiment 3 of the present invention.

FIG. 11 is a side view showing a laser device in accordance with Embodiment 3 of the present invention. Although the example in which the solid-state laser element 3 and the wavelength conversion element 4 are arranged on the heat sink 2 is shown in above-mentioned Embodiment 1, a Cr film 5 (light absorption film) which is an optical absorption layer can be formed on the lower surfaces of the solid-state laser element 3 and the wavelength conversion element 4 (side surfaces being parallel to the optical axes of the solid-state laser element and the wavelength conversion element 4 and being perpendicular to a plane including the optical axes and an angle of emergence).

In FIG. 11, an optical path of an S wave or a P wave is illustrated. The S wave or the P wave traveling in a direction of A is reflected upwardly by the end surface 3b, and, after that, reaches the Cr film 5 formed on the lower surfaces and apart of the wave is absorbed after being reflected by the upper surfaces. Further, the S wave or the P wave traveling in a direction of B is reflected downwardly by the end surface 4a, and reaches the Cr film 5 formed on the lower surfaces and a part of the wave is absorbed. However, because the fundamental wave traveling in the direction of A and in the direction of B travels in substantially parallel with the solid-state laser element 3 and the wavelength conversion element 4, the absorption by the Cr film 5 is small.

A difference in the optical absorption due to the above-mentioned optical loss suppresses the parasitic oscillation caused by the S wave or the P wave reflected by the joining portion. Although the example in which the Cr film 5 is formed on the lower surfaces of the solid-state laser element 3 and the wavelength conversion element 4 is shown in FIG. 11, the Cr film 5 can be alternatively formed on the upper surfaces of the solid-state laser element 3 and the wavelength conversion element 4, or the Cr film 5 can be alternatively formed on both the upper surfaces and the lower surfaces of the solid-state laser element 3 and the wavelength conversion element 4. Further, although the example in which the Cr film 5 is formed on the lower surfaces of the solid-state laser element 3 and the wavelength conversion element 4 is shown in FIG. 11, the Cr film 5 can be formed on either the lower surface or the like of the solid-state laser element 3 or the lower surface or the like of the wavelength conversion element 4.

The laser device according to this Embodiment 3 is acquired by joining the solid-state laser element 3 and the wavelength conversion element 4 to each other, and, after that, grinding their upper and lower surfaces, and then vapor-depositing the Cr film 5 on the lower surfaces. It is also possible to use an adhesive for the joining between the Cr film 5 and the heat sink 2 in order to facilitate the production. In this case, because it is difficult for light to reach the adhesive due to the optical absorptive action of the Cr film 5, there is also provided an advantage of making it difficult for degradation to occur in the adhesive, thereby improving the reliability.

In this case, any material can be used as the Cr film 5 which is a light absorption film as long as the material absorbs the S wave or the P wave. For example, a metal membrane, such as Cr, can be used, or a multilayer film consisting of metal membranes can be used. The lower surfaces of the solid-state laser element 3 and the wavelength conversion element 4 on which the Cr film 5 is vapor-deposited does not have to be mirror ones. For example, in a case in which the lower surfaces are formed to be rough, it becomes more difficult for the problem of parasitic oscillation to arise because light reflected by the lower surfaces is scattered. The structure of the other components and methods of producing the components are the same as those according to above-mentioned Embodiment 1.

Embodiment 4

Figure 12:
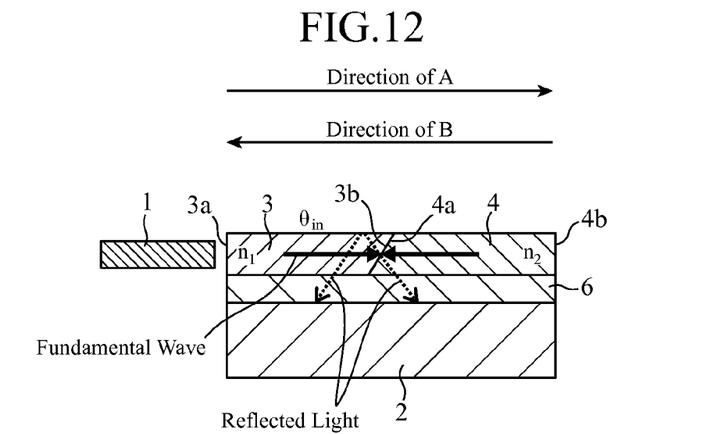
FIG. 12 is a side view showing a laser device in accordance with Embodiment 4 of the present invention.

FIG. 12 is a side view showing a laser device in accordance with Embodiment 4 of the present invention. Although the example in which the solid-state laser element 3 and the wavelength conversion element 4 are arranged on the heat sink 2 is shown in above-mentioned Embodiment 1, a substrate 6 (substrate having a refractive index close to those of the solid-state laser element 3 and the wavelength conversion element 4) that allows a part or all of the laser light to pass therethrough can be formed on the lower surfaces of the solid-state laser element 3 and the wavelength conversion element 4.

When the refractive index difference between the solid-state laser element 3 and the substrate 6 and the refractive index difference between the wavelength conversion element 4 and the substrate 6 are small to such extent that light traveling downward is not total-reflected, reflected light travels up to the substrate 6 having no gain and therefore the resonator gain becomes small. As a result, it becomes difficult for the laser device to oscillate. Further, the substrate 6 has an effect of preventing the fundamental wave from coming out toward the heat sink 2 and being absorbed by the heat sink. The substrate has another effect of easing the stress from the heat sink 2, and preventing unsticking from occurring at the joining portion between the solid-state laser element 3 and the wavelength conversion element 4. No mention is made here of the material of the substrate 6, and the same material as that of the wavelength conversion element 4 can be used typically.

Joining between the solid-state laser element 3 and the wavelength conversion element 4, and the substrate 6 can be implemented by using diffusion bonding, an optical contact, or surface activated bonding, or can be implemented by using an adhesive. The structure of the other elements and a method of producing the elements are the same as those according to above-mentioned Embodiment 1.

Although the example in which the substrate 6 is formed on the lower surfaces of the solid-state laser element 3 and the wavelength conversion element 4 is shown in FIG. 12, the substrate 6 can be alternatively formed on the upper surfaces of the solid-state laser element 3 and the wavelength conversion element 4, or the substrate 6 can be alternatively formed on both the upper and lower surfaces of the solid-state laser element 3 and the wavelength conversion element 4. Although the example in which the substrate 6 is formed on the lower surfaces of the solid-state laser element 3 and the wavelength conversion element 4 is shown in FIG. 12, the substrate 6 can be alternatively formed on either the lower surface or the like of the wavelength conversion element 4 or the lower surface or the like of the solid-state laser element 3.

Embodiment 5

Figure 13:
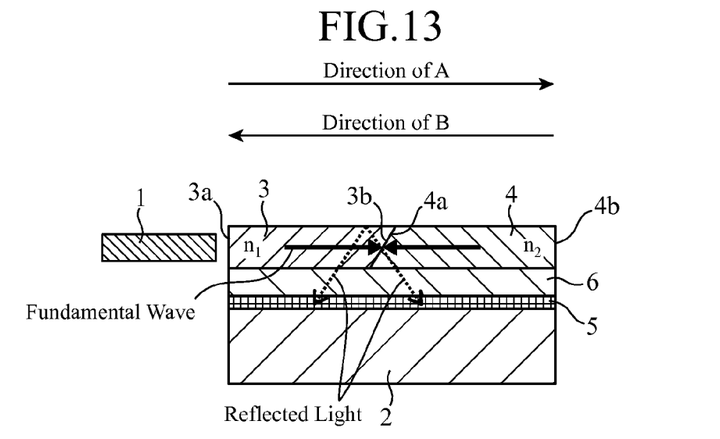
FIG. 13 is a side view showing a laser device in accordance with Embodiment 5 of the present invention.

FIG. 13 is a side view showing a laser device in accordance with Embodiment 5 of the present invention. Although the example in which the Cr film 5 is formed on the lower surfaces of the solid-state laser element 3 and the wavelength conversion element 4 is shown in above-mentioned Embodiment 3, the substrate 6 can be formed on the lower surfaces of the solid-state laser element 3 and the wavelength conversion element 4, like in the case of above-mentioned Embodiment 4, and a Cr film 5 which is an optical absorption layer can be formed on an outer side of the substrate 6. In this case, the suppression of the parasitic oscillation can be achieved because the Cr film 5 absorbs the reflected wave, like in the case of above-mentioned Embodiment 3. Further, because the substrate 6 is formed, the effect of suppressing the parasitic oscillation by the Cr film 5 becomes more remarkable. The structure of the other elements and a method of producing the elements are the same as those according to above-mentioned Embodiment 1.

Embodiment 6

Figure 14:
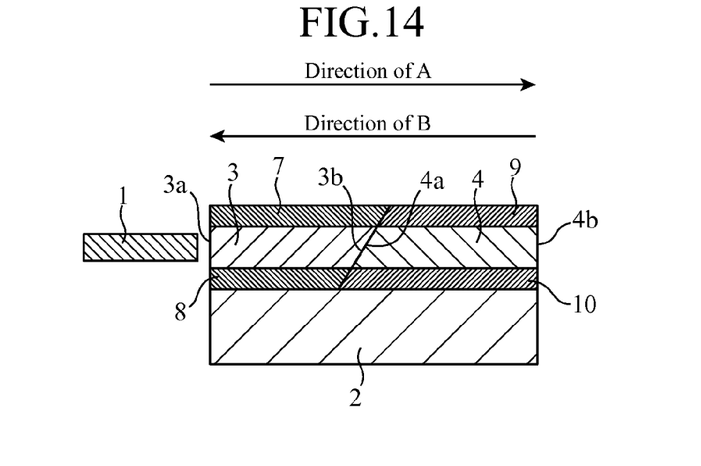
FIG. 14 is a side view showing a laser device in accordance with Embodiment 6 of the present invention.

FIG. 14 is a side view showing a laser device in accordance with Embodiment 6 of the present invention. Although the example in which the solid-state laser element 3 and the wavelength conversion element 4 are arranged on the heat sink 2 is shown in above-mentioned Embodiment 1, clad layers 7 and 8 (clad layers whose refractive indexes are smaller than that of the solid-state laser element 3) can be formed respectively on the upper and lower surfaces of the solid-state laser element 3, and clad layers 9 and 10 (clad layers whose refractive indexes are smaller than that of the wavelength conversion element 4) can be formed respectively on the upper and lower surfaces of the wavelength conversion element 4 so that the laser device has a structure of waveguide type.

Because the solid-state laser element 3 and the wavelength conversion element 4 are structured to be of waveguide type, the number of modes in a perpendicular direction can be reduced, and advantages resulting from the structure of waveguide type, such as an advantage of generating a large gain, can be provided. Further, because the effective refractive index changes according to the number of modes in a perpendicular direction in this case, the reflectivity in a high order mode can be increased by setting the angle of incidence to be equal to the Brewster angle for the effective refractive index in a fundamental mode. More specifically, mode selectivity which makes it easy for the laser device to oscillate in a lower order mode can be provided.

The clad layers 7 and 8 can be joined to the upper and lower sides of the solid-state laser element 3 by using an optical contact, diffusion bonding, or bonding with an adhesive. As an alternative, by forming films which are clad materials using vapor deposition or a sputtering method, the clad layers 7 and 8 can be formed. Similarly, the clad layers 9 and 10 can be joined onto the upper and lower sides of the wavelength conversion element 4 by using an optical contact, diffusion bonding, or bonding with an adhesive. As an alternative, by forming films which are clad materials using vapor deposition or a sputtering method, the clad layers 9 and 10 can be formed. In a case in which the light absorption film 5 is formed on the lower surfaces, the upper surfaces, or the upper and lower surfaces of the solid-state laser element 3 of waveguide type and the wavelength conversion element 4 of waveguide type, the same advantages as those provided by above-mentioned Embodiment 3 can be provided. The structure of the other elements and a method of producing the elements are the same as those according to above-mentioned Embodiment 1.

Although the example in which the clad layers 7 and 8 are formed respectively on the upper and lower surfaces of the solid-state laser element 3, and the clad layers 9 and 10 are formed respectively on the upper and lower surfaces of the wavelength conversion element 4 is shown in FIG. 14, the clad layers 7 and 8 can be alternatively formed respectively only on the upper and lower surfaces of the solid-state laser element 3, or the clad layers 9 and 10 can be alternatively formed respectively only on the upper and lower surfaces of the wavelength conversion element 4. As an alternative, the clad layers 7 and 9 can be alternatively formed respectively only on the upper surfaces of the solid-state laser element 3 and the wavelength conversion element 4, or the clad layers 8 and 10 can be alternatively formed respectively only on the lower surfaces of the solid-state laser element 3 and the wavelength conversion element 4.

Embodiment 7

Figure 15:
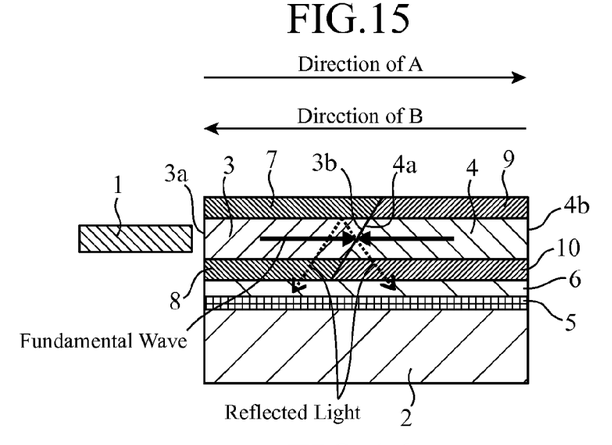
FIG. 15 is a side view showing a laser device in accordance with Embodiment 7 of the present invention.

FIG. 15 is a side view showing a laser device in accordance with Embodiment 7 of the present invention. Although the example in which the clad layers 7 and 8 are formed respectively on the upper and lower surfaces of the solid-state laser element 3, and the clad layers 9 and 10 are formed respectively on the upper and lower surfaces of the wavelength conversion element 4 is shown in above-mentioned Embodiment 6, a substrate 6 can be formed on the lower surfaces of the clad layers 8 and 10, the upper surfaces of the clad layers 9 and 10, or both the lower surfaces and the upper surfaces. Further, a Cr film 5 which is a light absorption film can be formed on an outer side of the substrate 6. As a result, the same advantages as those provided by both above-mentioned Embodiments 4 and 6 can be provided. A method of producing the laser device is the same as those in the case of above-mentioned Embodiments 4 and 6.

While the invention has been described in its preferred embodiments, it is to be understood that an arbitrary combination of two or more of the above-mentioned embodiments can be made, various changes can be made in an arbitrary component in accordance with any one of the above-mentioned embodiments, and an arbitrary component in accordance with any one of the above-mentioned embodiments can be omitted within the scope of the invention.

INDUSTRIAL APPLICABILITY

The laser device in accordance with the present invention is suitable for use as a laser device used for, for example, a light source such as a projector device. Particularly, the laser device in accordance with the present invention is suitable for use as a laser device that, even if the joining between the solid-state laser element 3 and the wavelength conversion element 4 unsticks and a gap occurs, needs to suppress deterioration of the optical power characteristics.

EXPLANATIONS OF REFERENCE NUMERALS 1 semiconductor laser element (pump laser), 2 heat sink, solid-state laser element, 3a and 3b end surface of solid-state laser element, 4 wavelength conversion element (optical element), 4a and 4b end surface of wavelength conversion element, 5 Cr film (light absorption film), 6 substrate, 7 to 10 clad layer, 101 semiconductor laser element, 102 heat sink, 103 solid-state laser element, 103a and 103b end surface of solid-state laser element, 104 wavelength conversion element, 104a and 104b end surface of wavelength conversion element.

The invention claimed is:
1. A laser device including:
a pump laser that emits pumping light,
a solid-state laser element that absorbs the pumping light emitted from said pump laser to generate laser light, and
an optical element upon which the laser light generated by said solid-state laser element is incident, wherein
an end surface of said solid-state laser element is sloped in such a way that, when said laser light is incident upon air from the end surface of said solid-state laser element, an angle of incidence which a normal to an end face on a side of said solid-state laser element in a plane of the incidence forms with a traveling direction of said laser light substantially matches a Brewster angle at the incidence plane, an end surface of said optical element is sloped in such a way that, when said laser light is incident upon air from the end surface of said optical element, an angle of incidence which a normal to an end face on a side of said optical element in a plane of the incidence forms with a traveling direction of said laser light substantially matches a Brewster angle at the incidence plane, and the end surface of said solid-state laser element and the end surface of said optical element are arranged in such a way as to be opposite to each other, and wherein
in at least one of the solid-state laser element and the optical element, a clad layer is formed on at least one of surfaces parallel to an optical axis in said solid-state laser element and an optical axis in said optical element and perpendicular to a plane including said optical axes and an angle of emergence so that said laser device has a structure of waveguide type, and wherein
a refractive index of the clad layer is smaller than that of the solid-state laser element.

2. The laser device according to claim 1, wherein the optical element is a wavelength conversion element that converts a wavelength of the laser light generated by the solid-state laser element.

3. The laser device according to claim 1, wherein when the angle of incidence which the normal to the end face on a side of the solid-state laser element in the incidence plane forms with the traveling direction of said laser light is expressed by $\theta_1$ and the Brewster angle at the incidence plane is expressed by $\theta_{B1}$ when the laser light is incident upon air from the end surface of said solid-state laser element, and the angle of incidence which the normal to the end face on a side of the optical element in the incidence plane forms with the traveling direction of said laser light is expressed by $\theta_2$ and the Brewster angle at the incidence plane is expressed by $\theta_{B2}$ when the laser light is incident upon air from the end surface of said optical element, the end surface of said solid-state laser element is sloped in such a way that said angle of incidence $\theta_1$ matches said Brewster angle $\theta_{B1}$ or said Brewster angle $\theta_{B2}$, or said angle of incidence $\theta_1$ lies between said Brewster angle $\theta_{B1}$ and said Brewster angle $\theta_{B2}$, and the end surface of said optical element is sloped in such a way that said angle of incidence $\theta_2$ matches said Brewster angle $\theta_{B1}$ or said Brewster angle $\theta_{B2}$, or said angle of incidence $\theta_2$ lies between said Brewster angle $\theta_{B1}$ and said Brewster angle $\theta_{B2}$.

4. The laser device according to claim 1, wherein the end surface of the solid-state laser element and the end surface of the optical element which are arranged in such a way as to be opposite to each other are joined to each other.

5. The laser device according to claim 1, wherein a gap is disposed between the end surface of the solid-state laser element and the end surface of the optical element which are arranged in such a way as to be opposite to each other.

6. The laser device according to claim 3, wherein the solid-state laser element and the optical element are plate-shaped members, and a direction of the laser light which is emitted at an angle of emergence of $\theta_1$ from said solid-state laser element and a direction of the laser light which is emitted at an angle of emergence of $\theta_2$ from said optical element are included in a plane perpendicular to a planar surface in said solid-state laser element and said optical element.

7. The laser device according to claim 1, wherein in at least one of the solid-state laser element and the optical element, a light absorption film that absorbs the laser light is formed on either one of surfaces parallel to an optical axis in said solid-state laser element and an optical axis in said optical element, and perpendicular to a plane including said optical axes and an angle of emergence.

8. The laser device according to claim 1, wherein in at least one of the solid-state laser element and the optical element, a substrate that allows a part or all of the laser light to pass therethrough is formed on either one of surfaces parallel to an optical axis in said solid-state laser element and an optical axis in said optical element, and perpendicular to a plane including said optical axes and an angle of emergence.

9. The laser device according to claim 1, wherein in at least one of the solid-state laser element and the optical element, a substrate that allows a part or all of the laser light to pass therethrough is formed on either one of surfaces parallel to an optical axis in said solid-state laser element and an optical axis in said optical element, and perpendicular to a plane including said optical axes and an angle of emergence, and wherein a light absorption film that absorbs said laser light is formed on a side of said substrate facing away from the solid-state laser element and the optical element.

10. The laser device according to claim 1, wherein a light absorption film that absorbs the laser light is formed on a side of the clad layer facing away from the solid-state laser element and the optical element.

11. The laser device according to claim 7, wherein the light absorption film is joined to a heat sink for cooling by using an adhesive.

12. The laser device according to claim 3, wherein the angle of incidence $\theta_1$ matches the angle of incidence $\theta_2$.

13. The laser device according to claim 3, wherein the angle of incidence $\theta_1$ matches the Brewster angle $\theta_{B1}$, and the angle of incidence $\theta_2$ matches the Brewster angle $\theta_{B2}$.

14. The laser device according to claim 2, wherein the solid-state laser element is an Nd-doped yttrium vanadate crystal, and the wavelength conversion element is an MgO-doped periodically poled lithium niobate crystal.

15. The laser device according to claim 2, wherein the solid-state laser element is an Nd-doped yttrium vanadate crystal, and the wavelength conversion element is an MgO-doped periodically poled lithium tantalate crystal.

16. The laser device according to claim 2, wherein the solid-state laser element is an Nd-doped gadolinium orthovanadate crystal, and the wavelength conversion element is an MgO-doped periodically poled lithium niobate crystal.

17. The laser device according to claim 2, wherein the solid-state laser element is an Nd-doped gadolinium orthovanadate crystal, and the wavelength conversion element is an MgO-doped periodically poled lithium tantalate crystal.

18. The laser device according to claim 1, wherein the clad layer is divided with ends that abut at the same Brewster angle as that at the incidence plane of the solid-state laser element or the optical element.

19. The laser device according to claim 1, wherein the clad layers are formed on both sides of the solid-state laser element and the optical element.

* * * * *